United States Patent [19]

Nakajima et al.

[11] Patent Number: 5,412,235
[45] Date of Patent: May 2, 1995

[54] MONOLITHIC INTEGRATED CIRCUIT INCLUDING GATE BIAS TRANSISTOR CONTROLLING THE GATE BIAS APPLIED TO AN AMPLIFYING TRANSISTOR

[75] Inventors: Yasuharu Nakajima; Hiroto Matsubayashi, both of Itami, Japan

[73] Assignee: Mitsubishi Denki Kabushiki Kaisha, Tokyo, Japan

[21] Appl. No.: 186,924

[22] Filed: Jan. 27, 1994

[30] Foreign Application Priority Data

May 19, 1993 [JP] Japan .................................. 5-116783

[51] Int. Cl.$^6$ .................. H01L 29/80; H01L 31/112; H03F 3/16
[52] U.S. Cl. .................................. 257/272; 257/275; 330/277
[58] Field of Search ............. 257/368, 272, 275, 140; 330/277; 437/47

[56] References Cited

U.S. PATENT DOCUMENTS

| | | | |
|---|---|---|---|
| 4,921,814 | 5/1990 | Ishikawa et al. | 437/47 |
| 4,987,384 | 1/1991 | Yamanouchi et al. | 330/277 |
| 4,990,973 | 2/1991 | Tshikawa et al. | 257/140 |
| 5,278,517 | 1/1994 | Fujita | 330/277 |

Primary Examiner—Steven Ho Yin Loke
Attorney, Agent, or Firm—Leydig, Voit & Mayer

[57] ABSTRACT

In a semiconductor integrated circuit, an amplifier FET and a gate bias FET, having the same structure as the amplifier FET and a total gate width smaller than that of the amplifier FET, are disposed close to each other. The gate bias FET is a constituent of a gate bias circuit for the amplifier FET, and the current determined by the drain current of the gate bias FET, first and second resistors respectively connected to drain and source of the gate bias FET, and a diode connected in series to the first resistor is applied to the amplifier FET as a gate bias voltage. In this structure, if the DC characteristic of the amplifier FET varies from chip to chip, the DC characteristic of the gate bias FET formed in the vicinity of and simultaneously with the amplifier FET also varies. Therefore, it is possible to make the operating current value of the amplifier FET consistent throughout a plurality of IC chips regardless of differences in the drain current of the amplifier FET, resulting in uniform high frequency characteristics, such as input-output characteristics, of the IC chips.

13 Claims, 10 Drawing Sheets

MONOLITHIC INTEGRATED CIRCUIT INCLUDING GATE BIAS TRANSISTOR CONTROLLING THE GATE BIAS APPLIED TO AN AMPLIFYING TRANSISTOR

FIELD OF THE INVENTION

The present invention relates to a semiconductor integrated circuit including an amplifier FET and a gate bias circuit for the amplifier FET.

BACKGROUND OF THE INVENTION

FIG. 7 is an equivalent circuit diagram illustrating a semiconductor integrated circuit (hereinafter referred to as IC) of a single-stage amplifier using a conventional gate bias circuit. In the figure, reference numeral 1 designates a field effect transistor (hereinafter referred to as FET), numeral 2 designates a signal input terminal, and numeral 3 designates a capacitor. An input end of the capacitor 3 is connected to the signal input terminal 2 and an output end of the capacitor 3 is connected to a gate of the FET 1. Reference numeral 10 designates a ground plane, numerals 112 and 113 designate resistors $R_{12}$ and $R_{13}$, respectively, and numeral 114 designates a gate bias terminal. An end of the resistor $R_{12}$ is connected to the output end of the capacitor 3 and to the gate of the FET 1 while the other end is connected to the gate bias terminal 114. An end of the resistor $R_{13}$ is connected to the output end of the capacitor 3 and to the gate of the FET 1 while the other end is connected to the ground plane 10. Reference numerals 21 and 22 designates first and second transmission lines, respectively, each serving as an output matching circuit. These transmission lines 21 and 22 are microstrip lines or coplanar lines formed on the IC. Reference numeral 23 designates an inductor which is formed by patterning a metal thin film having a prescribed width in spiral shape or meandering line shape. Reference numerals 24 and 25 designate capacitors, numeral 26 designates a drain bias terminal, and numeral 27 designates a signal output terminal.

FIG. 9 is a sectional view of the FET 1 included in the single-stage amplifier of FIG. 7. In the figure, reference numeral 31 designates a GaAs substrate. The FET includes a gate electrode 33 comprising tungsten silicide (WSi), a source electrode 36, and a drain electrode 37. The source and drain electrodes 36 and 37 comprise AuGe. An n type active region 32 is disposed within the substrate 31 and lies at a surface where the gate electrode 33 is disposed. Relatively heavily doped n+ type source and drain regions 34 and 35 are disposed within the substrate 31 lying below the source and drain electrodes 36 and 37, respectively. In production, the n type active region 32 is formed by implanting n type impurity ions, such as Si ions, into the substrate 31. Then, the center portion of the n type region is masked and the n+ type source and drain regions 34 and 35 are formed by heavily implanting the n type impurity ions.

A description is given of the operation.

A radiofrequency signal (hereinafter referred to as RF signal) which is input to the signal input terminal 2 is transmitted through the capacitor 3 to the gate of the FET 1. A partial voltage $V_{g1}$, which is determined by a voltage $V_{g0}$ applied to the gate bias terminal 114 and by the resistors $R_{12}$ and $R_{13}$ according to the following equation (1), is applied to the gate of the FET 1 as a gate voltage.

$$V_{g1} = V_{g0}(R_{13}/(R_{12}+R_{13})) \qquad (1)$$

Further, a drain voltage $V_{dd}$ is applied to the drain of the FET 1 from the drain bias terminal 26. Therefore, a drain current $I_{d1}$, which is determined by the drain voltage $V_{dd}$, the gate voltage $V_{g1}$, and the DC characteristic of the FET 1, flows between the source and the drain of the FET 1, whereby the RF signal in the gate of the FET 1 is amplified, and the amplified RF signal is transmitted through the first and second transmission lines 21 and 22 and the capacitor 25 and output from the signal output terminal 27.

FIG. 8 illustrates DC characteristics between the drain current $I_d$ and the gate voltage $V_g$ of the FET 1. A drain current $I_{d1}$ of the FET 1 is determined by the threshold voltage $V_{th}$ of the FET 1, the gain coefficient K, and the gate voltage $V_{g1}$ according to the following equation (2).

$$I_{d1} = K(V_{g1} - V_{th})^2 \qquad (2)$$

In the gate bias circuit shown in FIG. 7, the gate voltage $V_{g1}$ of the equation (2) is a fixed gate voltage determined by the equation (1), so that the above-described amplification is carried out with the drain current $I_{d1}$ according to the equations (1) and (2).

In the above-described gate bias circuit of the conventional semiconductor IC, the gate voltage $V_{g1}$ applied to the gate electrode of the FET 1 is fixed if the voltage $V_{g0}$ applied to the gate bias terminal 114 is constant. In the conventional semiconductor IC, however, it is impossible to fabricate a plurality of FETs 1 with uniform impurity dopant concentration and uniform thickness of the n type active layer 32 and uniform length of the gate electrode 33 from wafer to wafer or from lot to lot, so that the threshold voltage $V_{th}$ and the gain coefficient K in the equation (2), i.e., $I_{d1} = K(V_{g1} - V_{th})^2$, undesirably vary between devices, resulting in undesirable differences in the drain current $I_d$ between devices. In this case, as shown in FIG. 8, although the amplifier FET 1 is designed to have an operating point Q with the DC characteristic shown by the continuous line, the operating point unfavorably shifts to Q1 or Q2 if the DC profile varies as shown by the broken line (a) or (b), respectively resulting in undesirable variations in high frequency characteristics, such as input-output characteristics, from chip to chip.

SUMMARY OF THE INVENTION

It is an object of the present invention to provide semiconductor IC chips each including an amplifier FET whose operating current value is consistent throughout the IC chips regardless of differences in DC characteristics of the amplifier FET.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, in a semiconductor IC chip, a first FET for amplification and a second FET having the same structure as the first FET and a total gate width smaller than that of the first FET are disposed close to each other. The second FET is a constituent of a gate bias circuit for the first FET, and a current determined by the drain current of the second FET, first and second resistors respectively connected to the source and drain of the second FET, and a diode connected to the resistors in series is applied to the first FET as a gate bias voltage. In this structure, if the DC characteristic of the first FET varies from chip to chip, the DC characteristic of the second FET that is formed in the vicinity of and in the same process as the first FET also varies. That is, when the saturation current $I_{dss1}$ of the first FET is larger than a prescribed value, the drain current $I_{d2}$ of the second FET increases and the voltage determined by the drain current $I_{d2}$ and the resistance R also increases, so that the gate bias voltage $V_{g1}$ shifts in the negative direction. On the other hand, when the saturation current $I_{dss1}$ of the first FET is smaller than the prescribed value, the drain current $I_{d2}$ of the second FET decreases and the voltage determined by the drain current $I_{d2}$ and the resistance R also decreases, so that the gate bias voltage $V_{g1}$ shifts in the positive direction. In this way, the operation of the second FET compensates for the difference between the operating point and the desired operating point of the first FET and, therefore, it is possible to make the operating current $I_{d1}$ of the first FET consistent throughout a plurality of IC chips regardless of differences in the drain current of the first FET, resulting in uniform high frequency characteristics, such as input-output characteristics, of the IC chips.

According to the second aspect of the present invention, in the semiconductor IC, the second FET is disposed in the vicinity of the first FET so that the gate fingers of these two FETs are parallel to each other, and a bias pad of the second FET is disposed on a part of the IC chip outside the source of the second FET or outside the junction between a resistor that is connected to the source of the second FET, and a resistor that is connected to the gate of the second FET.

DETAILED DESCRIPTION OF THE PREFERRED EMBODIMENTS

Figure 1:
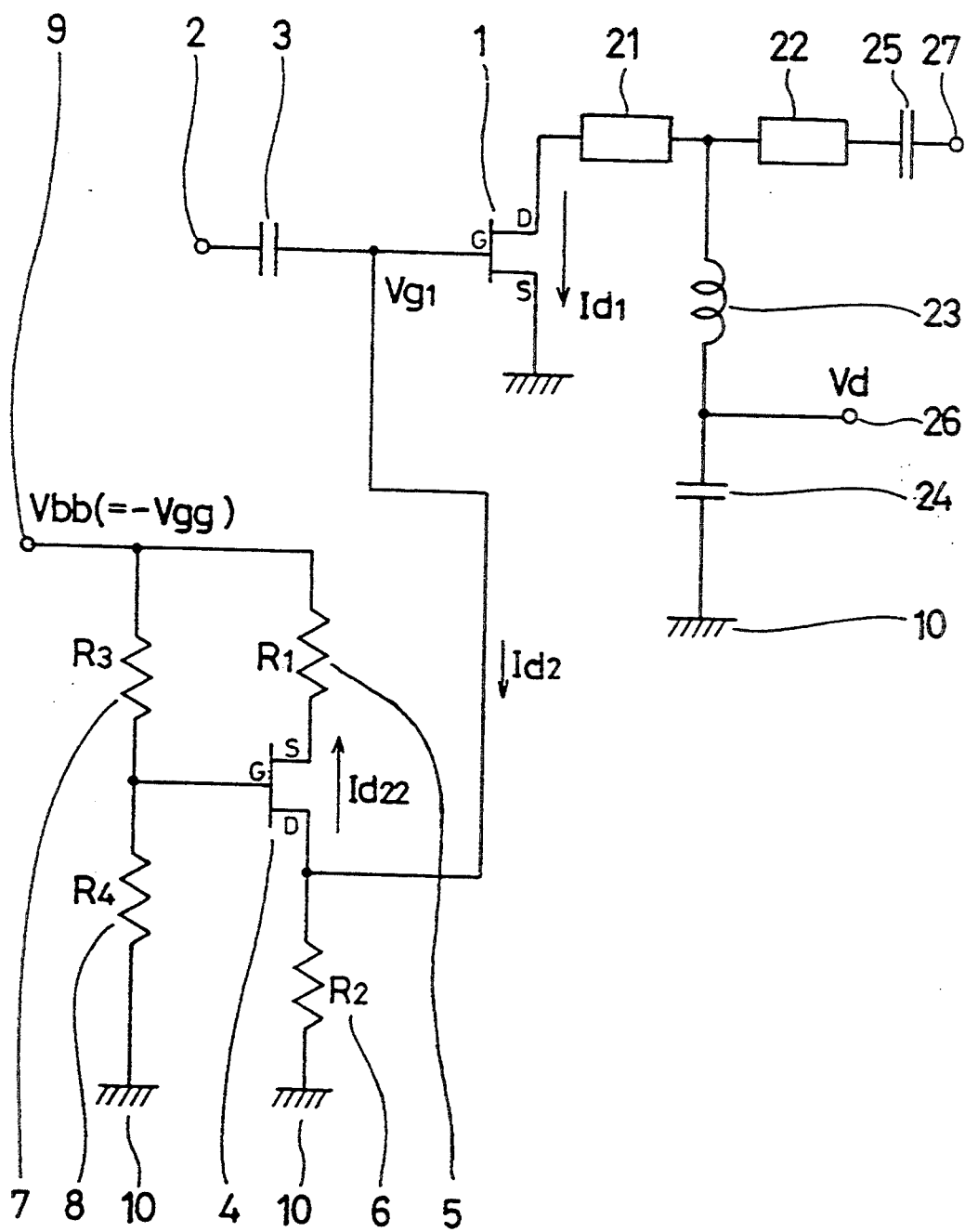
FIG. 1 is an equivalent circuit diagram of a semiconductor IC in accordance with a first embodiment of the present invention.
Figure 7:
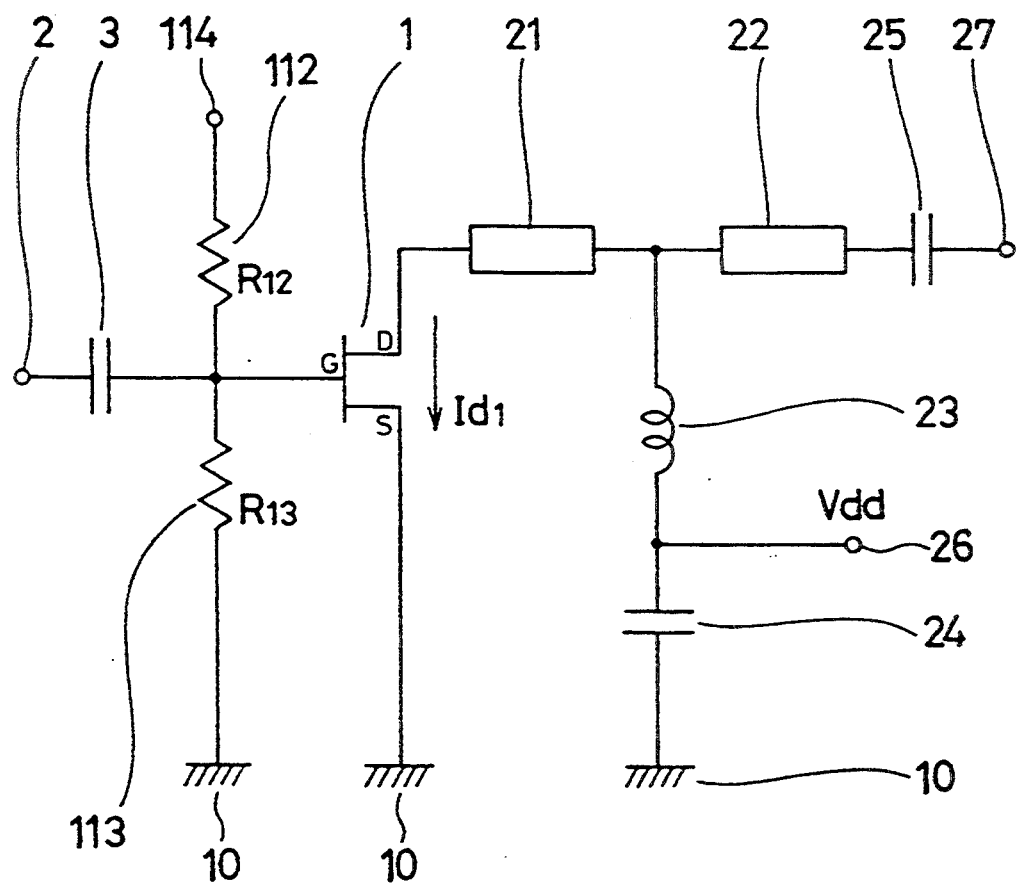
FIG. 7 is an equivalent circuit diagram of a semiconductor IC employing a conventional gate bias circuit.

FIG. 1 is an equivalent circuit diagram of a semiconductor IC in accordance with a first embodiment of the present invention. In the figure, the same reference numerals as those in FIG. 7 designate the same or corresponding parts. This circuit includes a first FET 1 for amplification and a second FET 4 as a gate bias source for the amplifier FET 1. The gate bias FET 4 has the same structure as the amplifier FET 1 and a total gate width 2 to 4 orders of magnitude smaller than that of the amplifier FET 1. These two FETs are arranged close to each other in the same IC chip. Reference numeral 9 designates a bias supply terminal for the gate bias FET 4. Reference numerals 5 to 8 designate first to fourth resistors $R_1$ to $R_4$, respectively.

A description is given of the structure of the gate bias circuit for the amplifier FET 1.

The gate (G) of the FET 4 is connected to the bias supply terminal 9 of the FET 4 via the resistor $R_3$ and to the ground plane 10 via the resistor $R_4$. The source (S) of the FET 4 is connected to the bias supply terminal 9 via the resistor $R_1$. The drain (D) of the FET 4 is connected to the ground plane 10 via the resistor $R_2$ and to the gate bias terminal of the amplifier FET 1.

On the drain side of the amplifier FET 1, the first and second transmission lines 21 and 22, the inductor 23, the capacitors 24 and 25, the drain bias terminal 26, and the signal output terminal 27 are connected in the same way as the conventional circuit.

A description is given of the operation.

An RF signal input to the signal input terminal 2 is transmitted through the capacitor 3 to the gate of the amplifier FET 1. The RF signal is amplified in the FET 1 and the amplified signal is output from the drain of the FET 1, transmitted through the signal transmission lines 21 and 22 and the capacitor 25, and output from to the signal output terminal 27.

Figure 9:
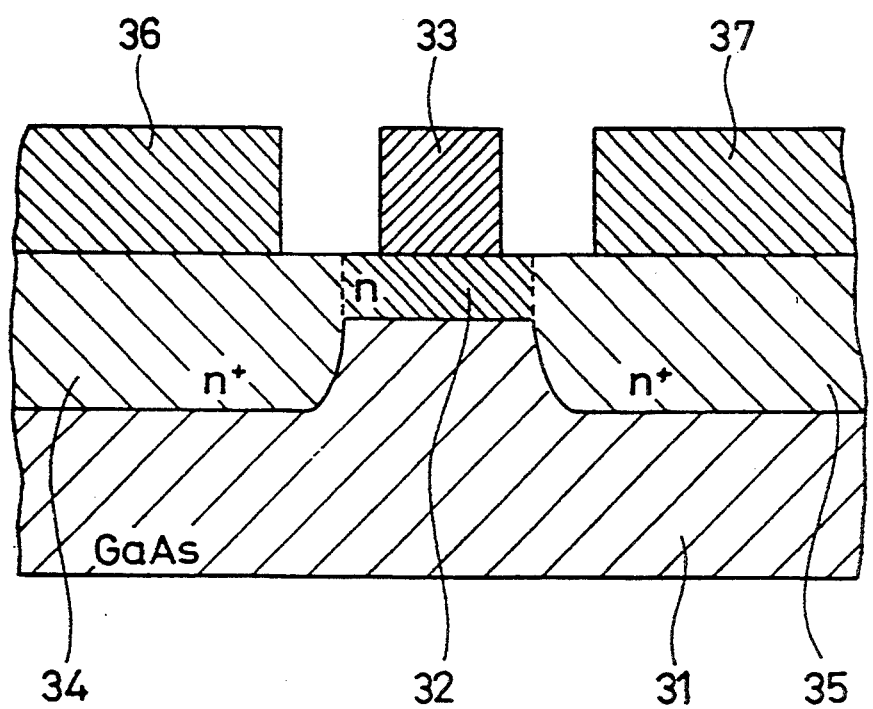
FIG. 9 is a sectional view illustrating a part of a conventional single-stage amplifier FET.

The operating point of the amplifier FET 1 during the RF signal amplification will be described in detail. The cross sections of the FETs 1 and 4 are identical to that shown in FIG. 9.

A partial voltage $V_{g2}$, which is determined by a voltage $V_{bb}$ applied to the bias supply terminal 9 and by the resistors $R_3$ and $R_4$ according to the following equation (3), is applied to the gate of the FET 4 as a gate voltage.

$$V_{g2} = V_{bb}(R_4/(R_3+R_4)) \qquad (3)$$

The bias voltage $V_{bb}$ is also applied to the resistor $R_2$, the drain and the source of the FET 4, and the resistor $R_1$ which are connected in series. The DC characteristics between the drain-source current $I_{d22}$ of the FET 4 and the bias voltage $V_{bb}$ are shown by the continuous line (a) in FIG. 3, and the gate voltage $V_{g2}$ determined by the equation (3) is applied to the gate of the FET 4, whereby the drain current $I_{d2}$ of the FET 4 is determined. In addition, the junction of the drain of the FET 4 and the resistor $R_2$ is connected to the gate electrode of the FET 1, so that the gate bias voltage $V_{g1}$ of the amplifier FET 1 is represented as follows:

$$V_{g1} = I_{d2} \cdot R_2 \qquad (4)$$

The operating point of the amplifier FET 1 is the gate voltage $V_{g1}$ determined in the equation (4), and the amplifier FET 1 operates at the voltage $V_{g1}$.

Figure 8:
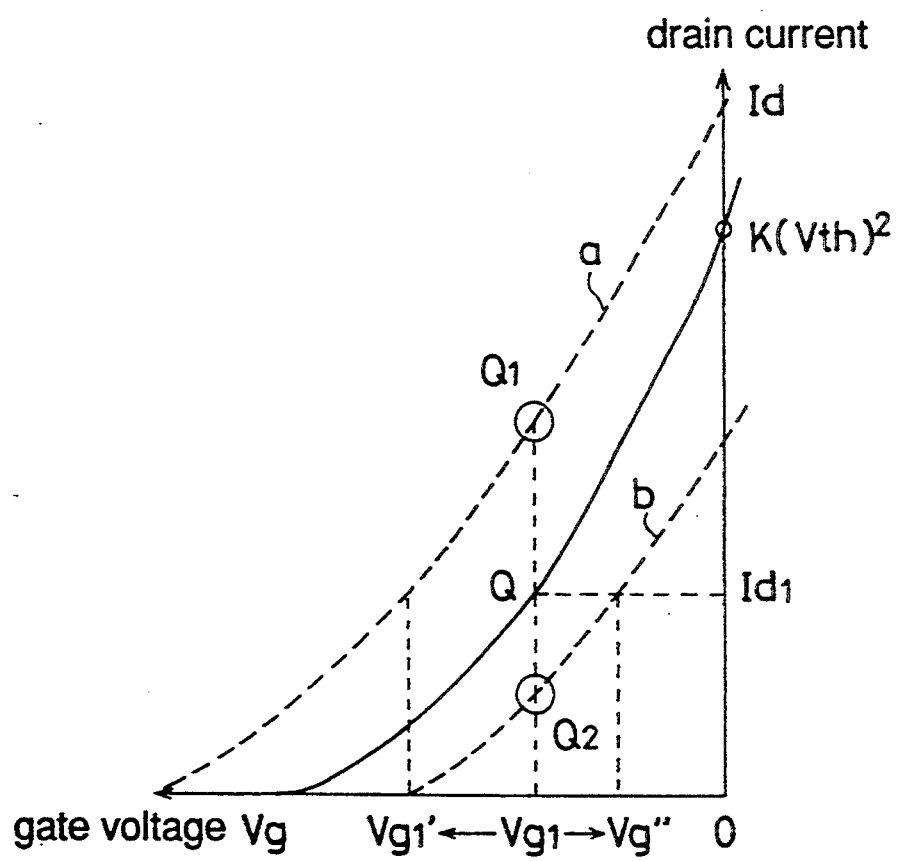
FIG. 8 is a graph showing I-V characteristics between drain-source current $I_d$ and gate voltage $V_g$ of an amplifier FET.

According to the first embodiment of the present invention, if the DC characteristic of the amplifier FET 1 varies from chip to chip and the drain-source current of the FET 1 is larger than the design value (broken line (a) in FIG. 8), the drain-source current $I_{d2}$ of the gate bias FET 4 which is in proportion to the drain current of the amplifier FET 1 is also large. Therefore, the voltage at the drain of the FET 4, i.e., the gate bias voltage $V_{g1}$ of the FET 1 determined by the equation (4), also shifts to $V_{g1}'$ from $V_{g1}$ in the negative direction when the prescribed bias voltage $V_{bb}(=V_{gg})$ is applied, whereby the operating point of the FET 1 is compensated to the prescribed design value $I_{d1}$.

On the other hand, if the drain-source current of the amplifier FET 1 is smaller than the design value (broken line (b) in FIG. 8), the drain-source current $I_{d22}$ of the FET 4 is also small and, therefore, the voltage at the drain of the FET 4, i.e., the gate bias voltage $V_{g1}$ of the FET 1 determined by the equation (4), also shifts to $V_{g1}'$ from $V_{g1}$ in the positive direction when the prescribed bias voltage $V_{dd}(=-V_{gg})$ is applied, whereby the operating point of the FET 1 is compensated to the prescribed design value $I_{d1}$.

Figure 10:
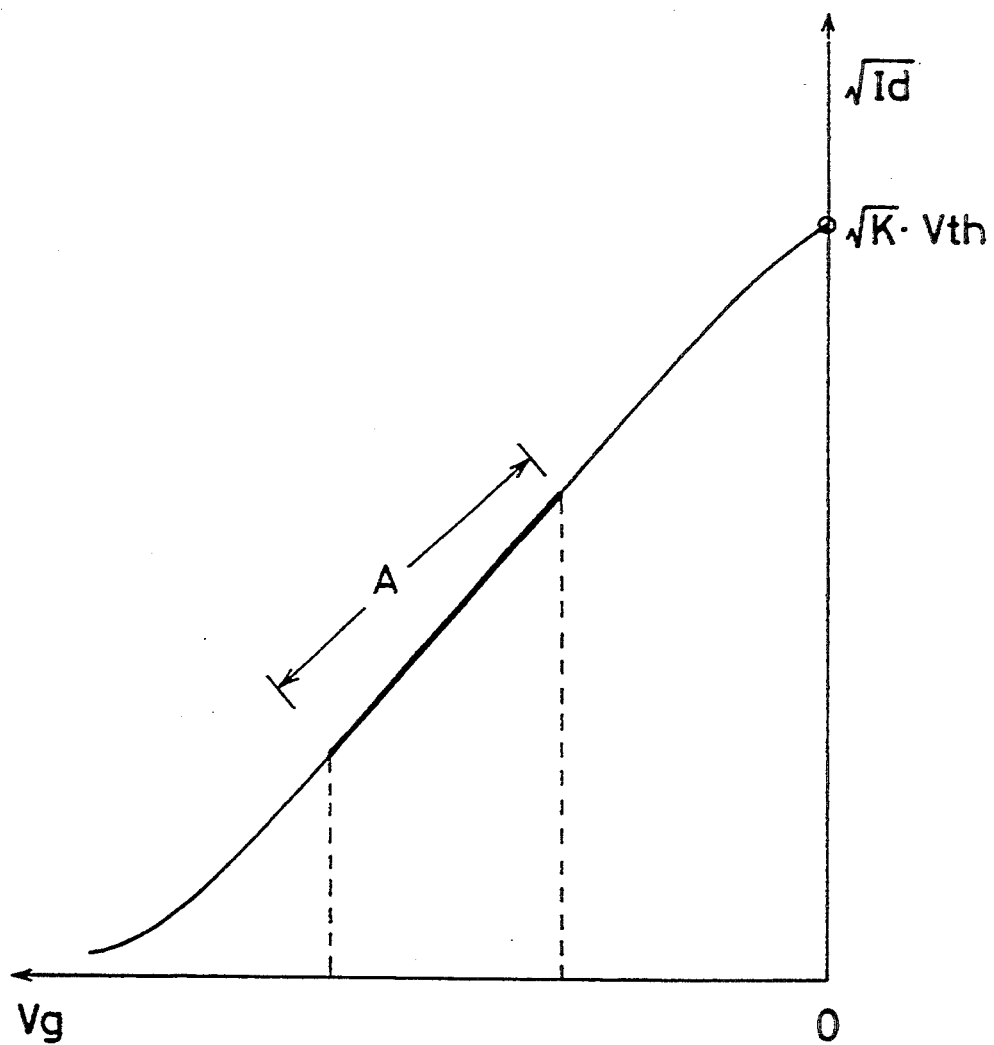
FIG. 10 is graph showing I-V characteristics between drain-source, current $I_d$ and gate voltage $V_g$ of a conventional gate bias FET.

Meanwhile, Japanese Published Patent Application No. 2-84764 (Corresponding U.S. Pat. No. 4,921,814) discloses a gate bias circuit for an amplifier MESFET having a gate recess structure, which gate bias circuit includes, like the present invention, resistors and a MESFET serving as a compensated gate bias source for the amplifier MESFET (see FIG. 2 of the publication). In production, wet etching of the gate recesses for the amplifier FET and the gate bias FET is carried out at the same time such that the recesses for the two FET's are of precisely the same depth. Therefore, if the depth of the gate recess is deeper (or shallower) than a desired depth, the saturation current decreases (or increases) in the amplifier FET and the gate bias voltage shifts in the positive (or negative) direction in the gate bias FET, whereby the bias voltage of the amplifier is always constant. However, the gate bias circuit of this prior art only corrects variations resulting from production steps structure from that of the present invention. This difference in circuit structures between the prior art and the present invention causes a difference in their compensating operations. More specifically, in the prior art circuit, the gate and source of the gate bias FET 5 are short-circuited and only the drain current $I_{DSS}$ at the gate voltage of 0 V is used, so that the gate bias point is determined only by the resistor $R_{B2}$. That is, in FIG. 10, a point $\sqrt{K} \cdot V_{th}$ on the axis of $V_g=0$ is the operating point of the gate bias FET, and only the drain current $I_{DSS}$ ($\sqrt{I_{DSS}}=\sqrt{K} \cdot V_{th}$) at the gate voltage of 0 V is used. The gradient of the drain current $I_{DSS}$ profile at the point on the axis of $V_g=0$ varies with variations in the production process. In the prior art gate bias circuit, the variation in the drain current $I_{DSS}$ is compensated by the simultaneous etching of the gate recesses for the amplifier FET and the gate bias FET. In this gate bias circuit, however, the bias point cannot be set at an arbitrary point and the operating points of both FETs are different from each other, so that sufficient compensation is impossible. On the other hand, in the present invention, the operating point of the gate bias FET 4 is in a range "A" shown in FIG. 10 with the same voltage-current characteristic as that of the operating point of the amplifier FET 1, achieving precise compensation for the operation of the amplifier FET 1.

Japanese Published Patent Application No. 2-101808 discloses a high frequency amplifier circuit including a first amplifier FET and a second FET serving as a gate bias source for the first amplifier FET (see FIG. 1 of the publication). In this prior art circuit, the output signal level of the amplifier FET is reduced and the drain current of the gate bias FET is increased, whereby the gate bias of the amplifier FET is deepened to reduce the source-drain current, and the efficiency at the low signal level is improved. However, differently from the present invention, this prior art circuit is not for compensating variations in the production process but for compensating variations in the output power due to an increase or decrease in the input power during operation by extracting a feedback signal from the amplified output signal and applying the feedback signal to the gate. Accordingly, it is described in this prior art that the second gate bias FET should be arranged in close to the second amplifier FET and these FETs may be included in a hybrid integrated circuit. However, the close arrangement of these the two FETs is only for making the IC chip compact and, differently from the present invention, these two FETs are not monolithically manufactured on the same substrate. In addition, this prior art circuit is not for compensating for variations due to production processing by operating the two FETs at the same operating point.

Japanese Published Patent Application No. 2-151109 discloses a similar gate bias circuit including a gate bias FET 12, resistors 10a and 10b, and the like (see FIG. 1 of the publication). In this gate bias circuit, however, the gate bias FET 12 is used as a resistor. In addition, since the gate and the drain or the source is directly connected like the above-described publication No. 2-84764, only the gate voltage 0 V point on the $I_d$–$V_g$ profile is used. Therefore, the operating points of both FETs differ from each other, and sufficient compensation is not achieved. On the other hand, in the present invention, since the amplifier FET and the gate bias FET operate at the same operating point, precise compensation is possible.

Hereinafter, the compensation mechanism according to the above-described publications No. 2-84764 and No. 2-151109 are compared to the compensation mechanism according to the first embodiment of the present invention.

Figure 2:
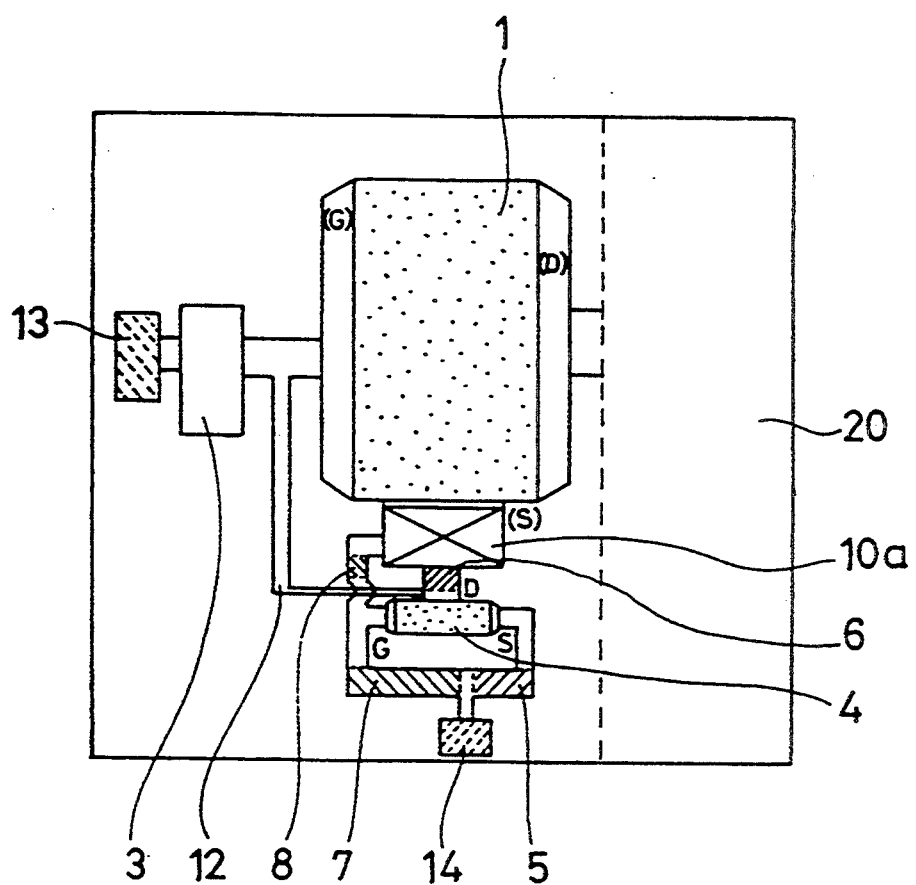
FIG. 2 is a plan view illustrating a chip pattern of the semiconductor IC of FIG. 1.

In the publication No. 2-84764, assuming that the drain saturation currents of the FETs 4 and 5 are respectively $I_{dss1}$ and $I_{dss2}$, the set drain current $I_{d1}$ of the amplifier FET 4 during the operation is represented as follows:

$$I_{d1} = I_{dss1} - g_{m1} \cdot I_{dss2} \cdot R_{b2} \tag{5}$$

where $g_{m1}$ is the transconductance of the FET 4 and $R_{b2}$ is the resistance value of the bias resistor $R_B$ of FIG. 2.

If the current characteristic of the set drain current $I_{d1}$ varies due to variations in production processing the drain current $I_{d1}'$ is represented as follows:

$$I_{d1}' = \tag{5'}$$
$$I_{dss1}' - g_{m1}' \cdot I_{dss2}' \cdot R_{b2} \approx (1+\delta)I_{dss1} - g_{m1} \cdot (1+\delta)I_{dss2} \cdot R_{b2}$$

where $\delta$ is the variation in the drain current due to the variation in the production. The difference $\Delta I_{d1}$ between the set drain current $I_{d1}$ and the drain current $I_{d1}'$ is represented as follows:

$$\Delta I_{d1} = I_{d1}' - I_{d1} = \delta I_{dss1} - g_{m1} \cdot \delta I_{dss2} \cdot R_{b2} = \delta I_{d1} \quad (6)$$

If it is assumed that the FET 4 performs class A amplification, the drain current $I_{d1}$ is set to $\frac{1}{2} I_{dss1}$ and the above equation (6) is converted to $$\Delta I_{d1} = \delta(\tfrac{1}{2}I_{dss1}) \quad (7)$$

From the equation (7), it is found that if the operating current $I_{d1}$ is set to a prescribed percentage of $I_{dss1}$, the operating current $I_{d1}$ varies by the difference $\Delta I_{d1}$.

In Japanese Published Patent Application No. 2-151109, assuming that the drain saturation currents of the amplifier FET 6 and the bias FET 12 shown in FIG. 1 are respectively $I_{dss1}$ and $I_{dss2}$ and the respective transconductances are $g_{m1}$ and $g_{m2}$, the pinch-off voltage $V_{p2}$ of the bias FET 12 is represented as follows:

$$V_{p2} \approx -g_{m2} \cdot I_{dss2} \quad (8)$$

Assuming that the resistance values of the gate bias resistors 10a and 10b are respectively $R_{10a}$ and $R_{10b}$, the set drain current $I_{d1}$ of the amplifier FET 6 is represented as follows:

$$I_{d1} = I_{dss1} + g_{m1} \cdot V_{g1} = I_{dss1} + g_{m1} \cdot (R_{10a}/R_{10a}+R_{10b}) \cdot V_{p2} \quad (9)$$
$$\approx I_{dss1} - g_{m1} \cdot (R_{10a}/R_{10a}+R_{10b}) \cdot g_{m2} \cdot I_{dss2}$$

In the above equation (9), if the current characteristic of the set drain current $I_{d1}$ varies due to variations in production processing as in the equation (5), the varying drain current $I_{d1}'$ is represented as follows:

$$I_{d1}' = I_{dss1}' - g_{m1}' \cdot (R_{10a}/R_{10a}+R_{10b}) \cdot g_{m2}' \cdot I_{dss2}' \approx \quad (9)'$$
$$(1+\delta)I_{dss1} - g_{m1} \cdot (R_{10a}/R_{10a}+R_{10b}) \cdot g_{m2} \cdot$$
$$(1+\delta)I_{dss2} = I_{d1} + \delta I_{d1}$$

In this case, the difference $\Delta I_{d1}$ between the set drain current $I_{d1}$ and the drain current $I_{d1}'$ due to the variations in production processing is equal to that of the equation (6) according to the publication No. 2-84764, and approximately the same effect of compensation as described above is attained.

On the other hand, in the first embodiment of the present invention, assuming that the drain saturation currents of the FET 1 and the FET 4 are respectively $I_{dss1}$ and $I_{dss2}$, the set drain current $I_{d1}$ in the operation state is represented as follows:

$$I_{d1} = I_{dss1} - g_{m1} \cdot I_{d22} \cdot R_2 \quad (10)$$

where $g_{m1}$ is the transconductance of the FET 1. Then, the drain-source current $I_{d22}$ of the FET 4 in the operation state is represented as follows:

$$I_{d22} = I_{dss2} + \quad (11)$$

$$g_{m2} \cdot V_{g2} = I_{dss2} + g_{m2} \cdot \left( -\frac{R_4}{R_3+R_4} \cdot V_{gg} + R_1 \cdot I_{d22} \right) =$$

-continued $$\frac{1}{1-g_{m2} \cdot R_1} \cdot \left( I_{dss2} - \frac{R_4}{R_3+R_4} \cdot g_{m2} \cdot V_{gg} \right)$$

where $g_{m2}$ is the transconductance the FET 4.

If the current characteristic of the set drain current $I_{d1}$ varies due to variations in production processing the drain current $I_{d1}'$ is represented as follows:

$$I_{d1}' = I_{dss1}' - g_{m1}' \cdot I_{dss}' \cdot R_2 \quad (10)'$$

where the respective current values $I_{d1}'$, $I_{dss1}'$, $g_{m1}'$, and $I_{d22}'$ are the respective set current values $I_{d1}$, $I_{dss1}$, $g_{m1}$, and $I_{d22}$ and the variation $\delta$ due to variations in production processing, and the difference $\Delta I_{d1}$ between the set current value $I_{d1}$ and the current value $I_{d1}'$ is represented as in the following equation (12) according to the above equations (10) and (11) and the variation $\delta$.

$$\Delta I_{d1} = \quad (12)$$

$$I_{d1}' - I_{d1} = \delta I_{d1} - g_{m1} \cdot \frac{\delta}{1-g_{m2} \cdot R_2} \cdot \frac{R_4}{R_3+R_4} \cdot g_{m2} \cdot V_{gg}$$

Accordingly, in this first embodiment of the present invention, it is possible to select the resistors $R_2 \sim R_4$ in the above equation (12) so that the difference $\Delta I_{d1}$ between the set drain current $I_{d1}$ and the drain current $I_{d1}'$ is reduced, achieving an improved compensation compared to the above-described prior art publications Nos. 2-84764 and 2-151109.

FIG. 2 is a plan view illustrating an example of a chip pattern of the semiconductor IC including the gate bias circuit for the amplifier FET 1 according to the first embodiment of the present invention.

In FIG. 2, the same reference numerals as in FIG. 1 designate the same or corresponding parts. Reference numeral 10a designates a via-hole, numeral 12 designates a wiring metallization, numeral 13 designates a signal input pad corresponding to the signal input terminal 2 of FIG. 1, and numeral 14 designates a bias pad corresponding to the bias supply terminal 9 of FIG. 1. Reference numeral 20 designates an output matching/drain bias circuit for the amplifier FET 1, which comprises the transmission lines 21 and 22, the inductor 23, the capacitors 24 and 25, the drain bias terminal 26, and the signal output terminal 27.

In this gate bias circuit, the gate bias FET 4 having a gate width that is 2 to 4 orders of magnitude smaller than the total gate width of the amplifier FET 1 is disposed in the close vicinity of the amplifier FET 1 so that the gate fingers of these two FETs are parallel to each other. The source S of the FET 1, an end of the resistor $R_2$ which is not the end of the resistor $R_2$ that is connected to the drain D of the FET 4, and an end of the resistor $R_4$ which is not to the end connected to the gate G of the FET 4 are connected through the via-hole 10a to the ground plane 10 comprising a metal film formed on the rear surface of the substrate. The junction of the drain D of the FET 4 and the resistor $R_2$ is connected to the gate G of the FET 1 by the metallization 12. Further, the bias pad 14 is disposed on a part of the periphery of the IC chip outside the junction of the source S and the gate G of the FET 4 which are connected to each other via the resistors $R_1$ and $R_3$, respectively.

According to the first embodiment of the present invention, the first amplifier FET 1 and the second gate bias FET 4 which has the same structure as the first FET 1 and a total gate width smaller than that of the first FET 1 and is fabricated in the same process as the first FET 1 are arranged close to each other in the same IC chip as constituents of the gate bias circuit. The gate bias circuit is constructed so that the voltage at the drain of the second FET 4 which is determined by the drain current of the second FET 4 and the resistor $R_2$ connected to the drain is applied to the gate of the first FET as the gate bias voltage. In this structure, when the drain current $I_d$ of the first amplifier FET 1 varies from wafer to wafer or from lot to lot, the drain current of the second gate bias FET 4 that is formed in the vicinity of and in the same process as the first FET 1 also varies, whereby the operating point of the first FET 1 is compensated to a prescribed value. Therefore, the operating current value $I_{d1}$ of the first FET 1 is uniform throughout a plurality of semiconductor IC chips regardless of the variations in the drain current of the first FET 1, resulting in uniform high frequency characteristics, such as input-output characteristics, of the semiconductor IC chips.

Figure 4:
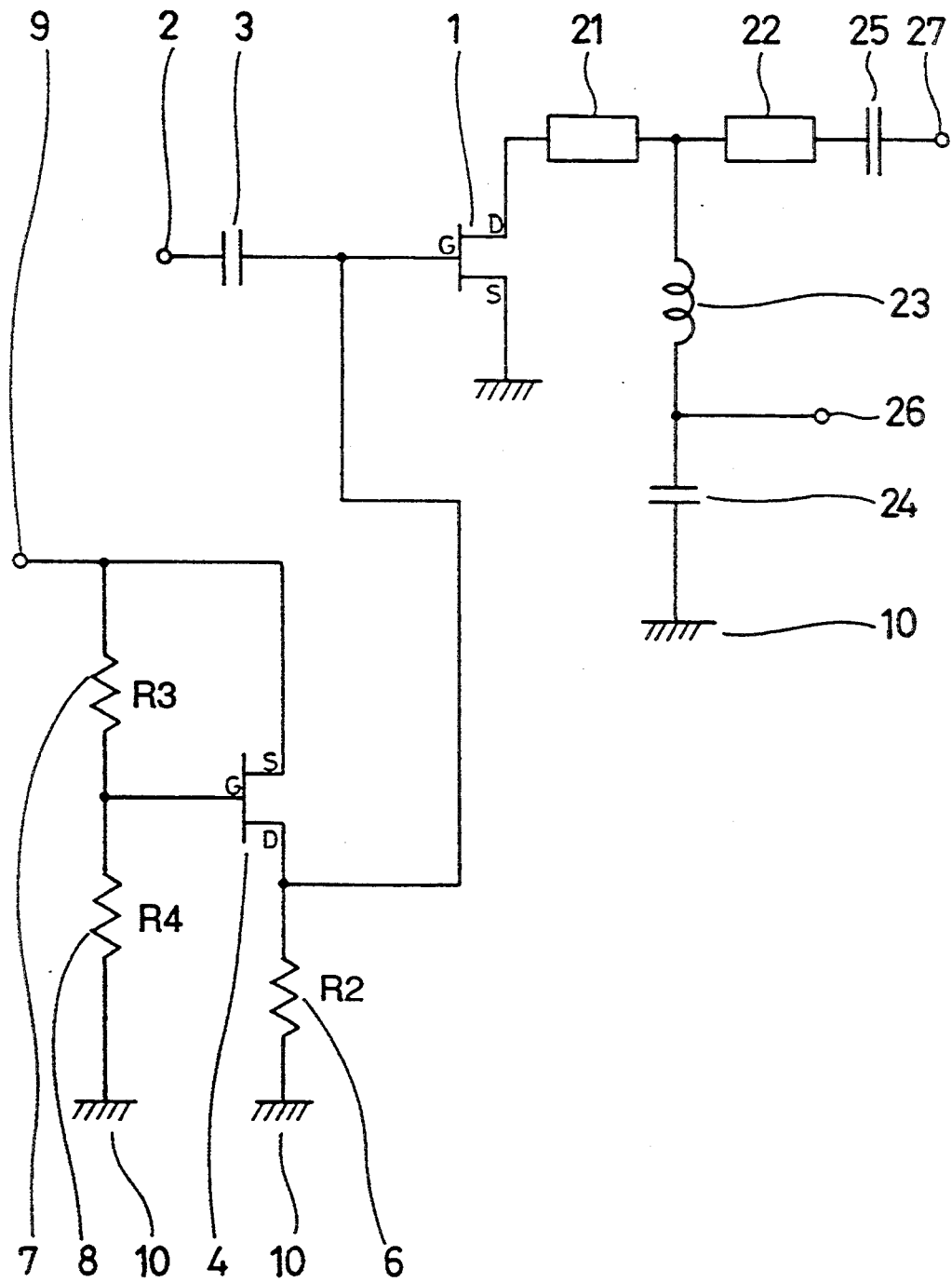
FIG. 4 is an equivalent circuit diagram of a semiconductor IC in accordance with a second embodiment of the present invention.

FIG. 4 is an equivalent circuit diagram of a semiconductor integrated circuit in accordance with a second embodiment of the present invention. In the figure, the same reference numerals as in FIGS. 1 and 7 designate the same or corresponding parts. While in the above-described first embodiment the resistor $R_1$ (5) is inserted between the source S of the FET 4 and the bias supply terminal 9, in this second embodiment the source S of the FET 4 is directly connected to the bias supply terminal 9. Other resistors $R_2$ (2), $R_3$ (7), and $R_4$ (8) and the second FET 4 are connected similarly as in the first embodiment. In addition, on the drain side of the FET 1, the first and second transmission lines 21 and 22, the inductor 23, the capacitors 24 and 25, the drain bias terminal 26, and the signal output terminal 27 are connected as in the prior art circuit shown in FIG. 7.

The operation of the gate bias circuit according to the second embodiment is similar to that of the first embodiment. The DC characteristic between the drain-source current $I_{d22}$ and the bias voltage $V_{bb}$ of the second FET 4 is shown by the broken line (b) of FIG. 3. Like the gate bias circuit of the first embodiment in which the gate voltage $V_{g2}$ determined by the equation (3) is applied to the gate of the FET 4, the FET 1 of this second embodiment performs amplification at the operating point of the gate bias voltage $V_{g1}$ of the FET 1 determined by the equation (4). Therefore, the same effects as described in the first embodiment are achieved in this second embodiment.

Figure 5:
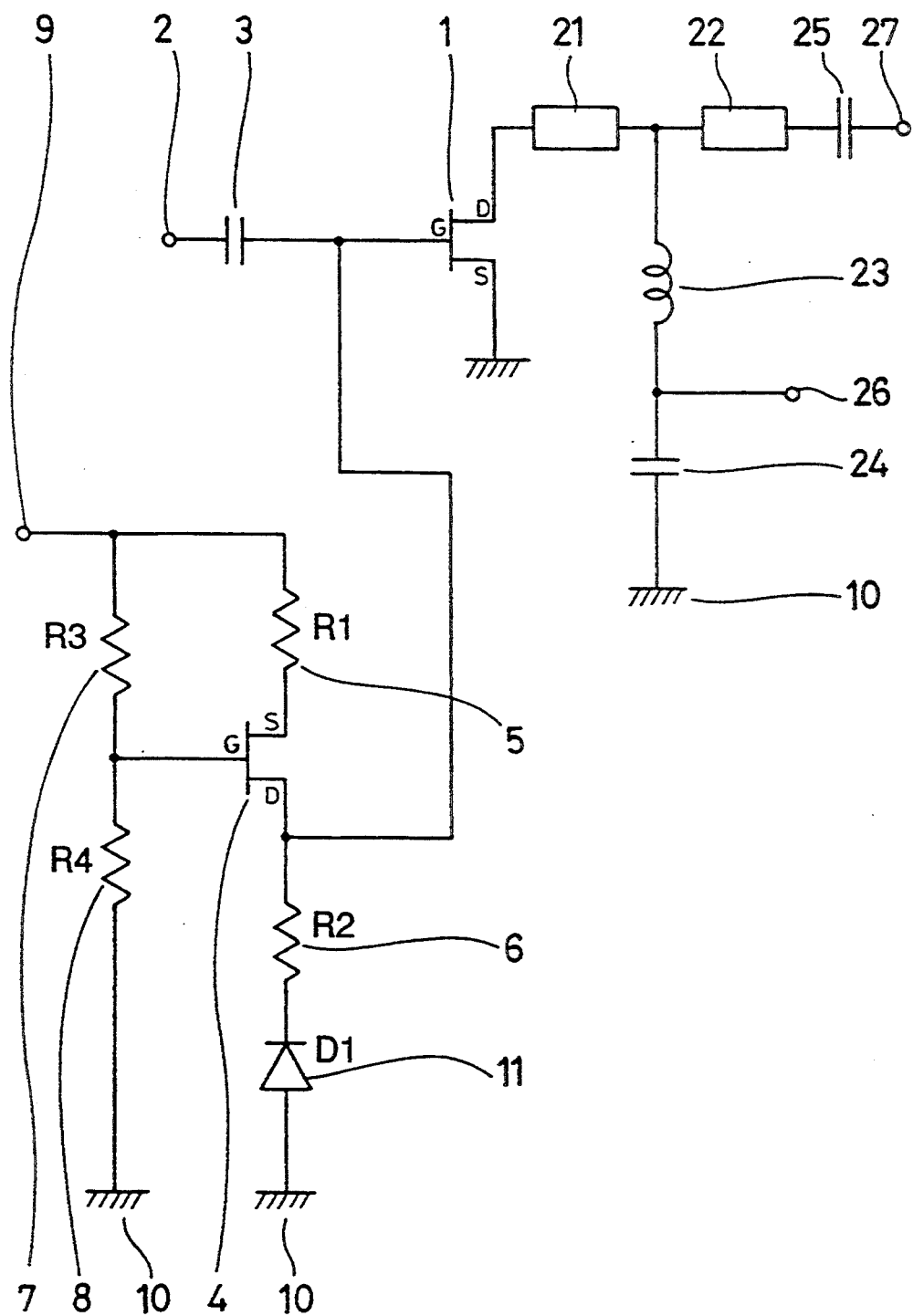
FIG. 5 is an equivalent circuit diagram of a semiconductor IC in accordance with a third embodiment of the present invention.

FIG. 5 is an equivalent circuit diagram of a semiconductor integrated circuit in accordance with a third embodiment of the present invention. In the figures, the same reference numerals as in FIGS. 1 and 7 designate the same or corresponding parts. In this third embodiment, a diode $D_1$ (11) is inserted between the gate bias FET 4 and the ground plane 10. More specifically, the cathode of the diode $D_1$ is connected to the drain of the gate bias FET 4 via the resistor $R_2$ and an anode of the diode $D_1$ is connected to the ground plane 10. The gate and the source of the gate bias FET 4 are connected as in the first embodiment. In addition, the structure on the drain side of the amplifier FET 1 is identical to that of the prior art circuit of FIG. 7.

Figure 3:
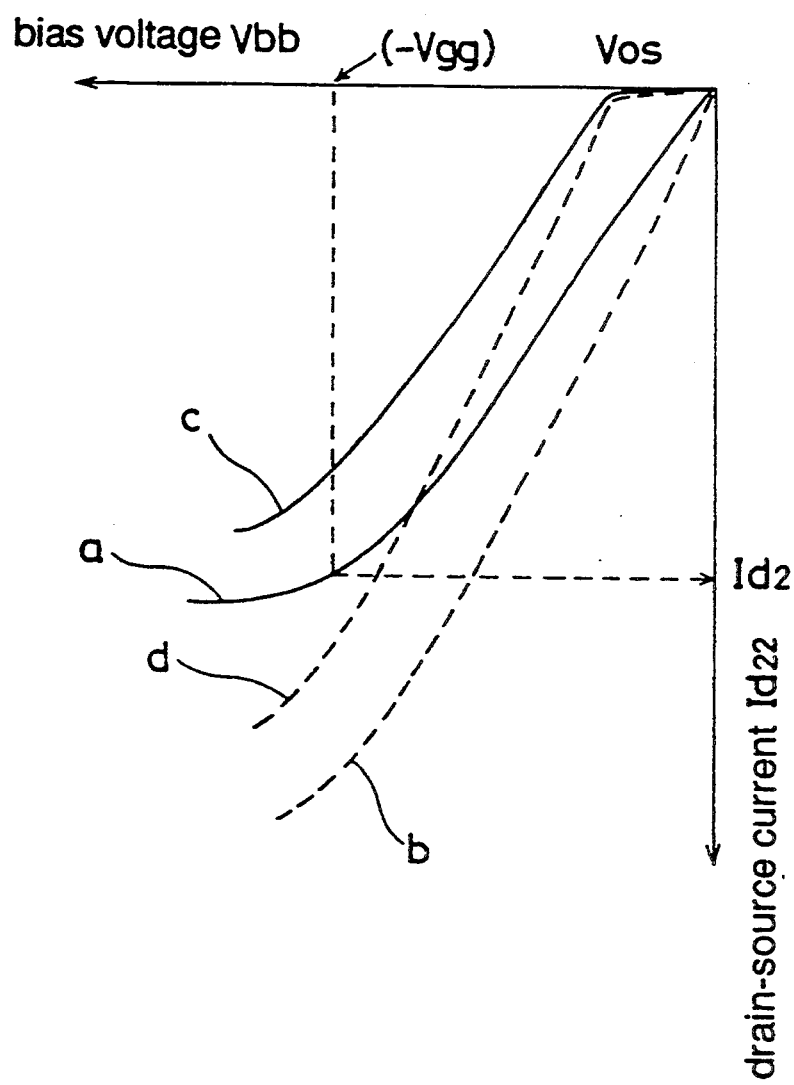
FIG. 3 is a graph showing I-V characteristics between drain-source current $I_{d2}$ and bias voltage $V_{bb}$ of a gate bias FET.

The DC characteristic between the drain-source current $I_{d22}$ and the bias voltage $V_{bb}$ according to this third embodiment is shown by the continuous line (c) of FIG. 3. As in above-described first and second embodiments, the amplification is performed at the operating point of the gate bias voltage $V_{g1}$ of the FET 1 determined by the equation (4). In this third embodiment, however, differently from the first and second embodiments, the DC characteristic shown by the continuous line (c) has the off-set voltage $V_{os}$, whereby the set voltage range of the gate bias voltage $V_{g1}$ can be varied from those of the first and second embodiments.

Figure 6:
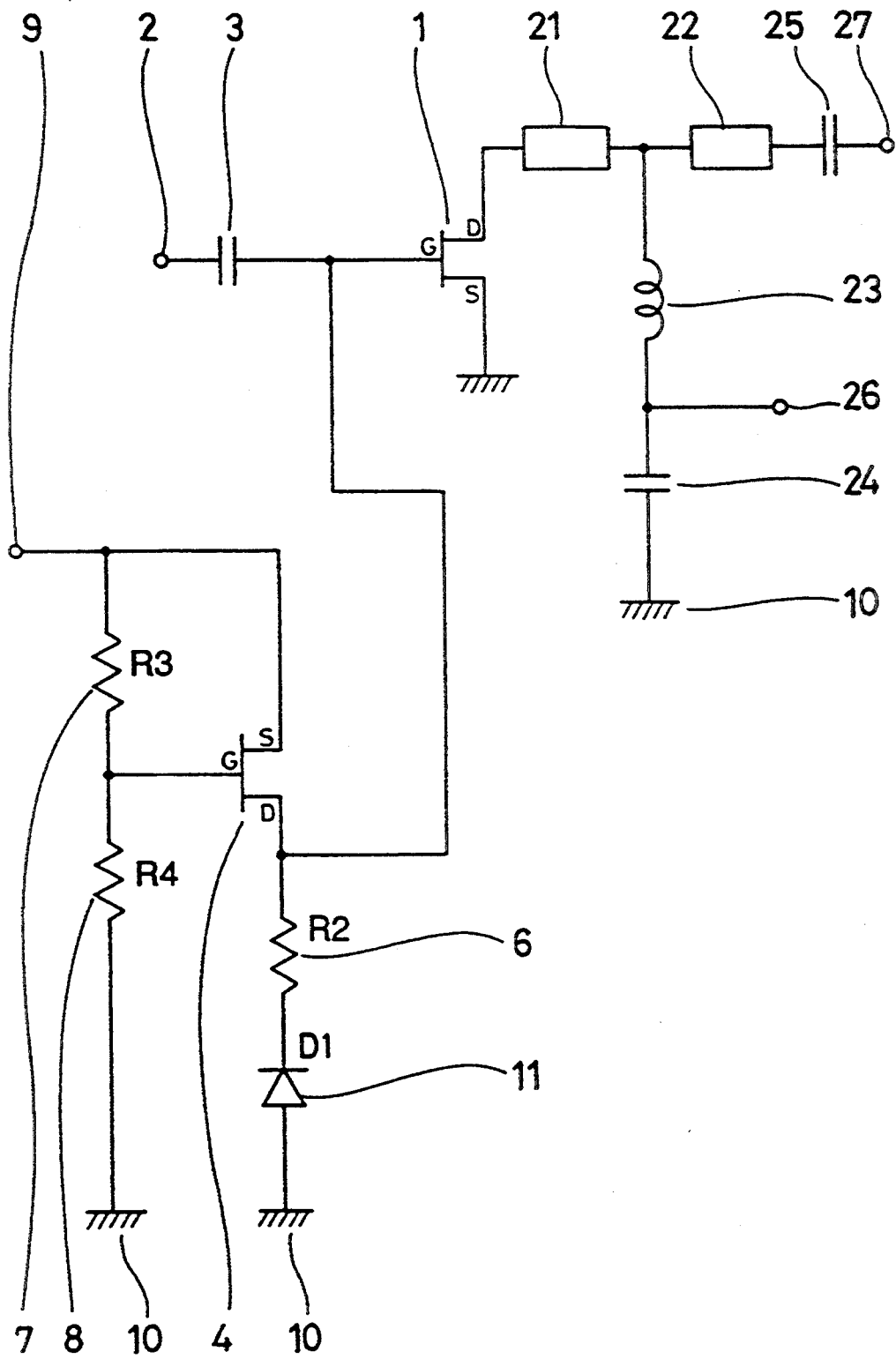
FIG. 6 is an equivalent circuit diagram of a semiconductor IC in accordance with a fourth embodiment of the present invention.

FIG. 6 is an equivalent circuit diagram of a semiconductor integrated circuit in accordance with a fourth embodiment of the present invention. In the figure, the same reference numerals as in FIGS. 1 and 7 designate the same or corresponding parts. Also in the fourth embodiment, the structure on the drain side of the FET 1 is identical to that of the prior art circuit shown in FIG. 7. The gate and the source of the gate bias FET 4 are connected as in the second embodiment. In addition, as in the third embodiment, the diode 11 is inserted between the gate bias FET 4 and the ground plane 10 so that the cathode is connected to the drain of the FET 4 via the resistor $R_2$ and the anode is connected to the ground plane 10. The operation of this gate bias circuit is identical to that of the third embodiment except that the relationship between the drain-source current, $I_{d2}$, and the bias voltage, $V_{bb}$, of the FET 4 is represented by the broken line (d) of FIG. 3.

While in the above-described third and fourth embodiments only one diode $D_1$ (11) is connected, two or more diodes may be connected and, in this case, the off-set voltage $V_{os}$ can be set to $n \cdot V_{bi}$ [V] using n diodes. When the diode is a Schottky diode employing a GaAs substrate, $V_{bi}$ is 0.6~0.75 [V].

While in the above-described first to fourth embodiments the single-stage amplifier including the amplifier FET 1 as one stage is described, a plurality of stages may be connected to make a multistage amplifier. Also in this case the same effects as described above are achieved if each stage of the amplifier FET is provided with a compensation circuit.

What is claimed is:

1. A semiconductor integrated circuit in which transistors, resistors, capacitors, and transmission lines, are monolithically integrated on a semiconductor substrate, said integrated circuit including:

a first field effect transistor having a source, a gate having a gate width, and a drain for amplifying an input signal;

a gate bias terminal connected to the gate of the first field effect transistor;

a second field effect transistor having a source, a gate, and a drain having, a gate width smaller than the gate width of the first field effect transistor and fabricated simultaneously with the first field effect transistor;

a bias supply terminal for the second field effect transistor;

first, second, and third resistors each having first and second ends;

a gate bias circuit comprising the second field effect transistor, the bias supply terminal, and the first, second, and third resistors wherein the source of the second field effect transistor is connected to the bias supply terminal, the gate of the second field effect transistor is connected to the bias supply terminal through the first resistor and to ground through the second resistor, and the drain of the second field effect transistor is connected to ground through the third resistor and to the gate bias terminal of the first field effect transistor, whereby the drain voltage of the second field effect transistor compensates for variations in the operating current of the first field effect transistor.

2. The semiconductor integrated circuit of claim 1 wherein the source of the second field effect transistor is directly connected to the bias supply terminal for the second field effect transistor.

3. The semiconductor integrated circuit of claim 2 wherein the second field effect transistor is disposed in the vicinity of the first field effect transistor and gate fingers of the first and second field effect transistors are parallel to each other and including a bias pad as the bias supply terminal of the second field effect transistor spaced from a junction of the source of the second field effect transistor and the first resistor.

4. The semiconductor integrated circuit of claim 2 wherein the second field effect transistor is disposed in the vicinity of the first field effect transistor and gate fingers of the first and second field effect transistors are parallel to each other and including a bias pad as the bias supply terminal of the second field effect transistor spaced from the first resistor and the third resistor.

5. The semiconductor integrated circuit of claim 2 including a diode interposed between the third resistor and the ground.

6. The semiconductor integrated circuit of claim 5 wherein the second field effect transistor is disposed in the vicinity of the first field effect transistor and gate fingers of the first and second field effect transistors are parallel to each other and including a bias pad as the bias supply terminal of the second field effect transistor spaced from the first resistor and the third resistor.

7. The semiconductor integrated circuit of claim 5 wherein the second field effect transistor is disposed in the vicinity of the first field effect transistor and gate fingers of the first and second field effect transistors are parallel to each other and including a biased pad as the bias supply terminal of the second field effect transistor spaced from a junction of the source of the second field effect transistor and the first resistor.

8. The semiconductor integrated circuit of claim 1 including a fourth resistor wherein the source of the second field effect transistor is connected to the bias supply terminal through the fourth resistor.

9. The semiconductor integrated circuit of claim 8 wherein the second field effect transistor is disposed in the vicinity of the first field effect transistor and gate fingers of the first and second field effect transistors are parallel to each other and including a bias pad as the bias supply terminal of the second field effect transistor spaced from the first resistor and the third resistor.

10. The semiconductor integrated circuit of claim 8 wherein the second field effect transistor is disposed in the vicinity of the first field effect transistor and gate fingers of the first and second field effect transistors are parallel to each other and including a bias pad as the bias supply terminal of the second field effect transistor spaced from a junction of the source of the second field effect transistor and the first resistor.

11. The semiconductor integrated circuit of claim 8 including a diode interposed between the third resistor and the ground.

12. The semiconductor integrated circuit of claim 11 wherein the second field effect transistor is disposed in the vicinity of the first field effect transistor and gate fingers of the first and second field effect transistors are parallel to each other and including a bias pad as the bias supply terminal of the second field effect transistor spaced from a junction of the source of the second field effect transistor and the first resistor.

13. The semiconductor integrated circuit of claim 11 wherein the second field effect transistor is disposed in the vicinity of the first field effect transistor and gate fingers of the first and second field effect transistors are parallel to each other and including a bias pad as the bias supply terminal of the second field effect transistor spaced from the first resistor and the third resistor.

* * * * *